United States Patent [19]

Filshie

[11] Patent Number: 5,272,279
[45] Date of Patent: Dec. 21, 1993

[54] GENERAL PURPOSE ELECTRICAL BOX KIT

[75] Inventor: Dave Filshie, Etobicoke, Canada
[73] Assignee: Bel Products Inc., Montréal-Nord, Canada
[21] Appl. No.: 907,180
[22] Filed: Jul. 1, 1992
[51] Int. Cl.⁵ .............................................. H05K 5/02
[52] U.S. Cl. ........................................ 174/50; 174/56; 220/3.2; 220/3.8; 312/291
[58] Field of Search .................... 174/50, 51, 52.1, 66; 220/3.3, 3.2, 3.7, 3.8, 241, 254; 29/401.1; 206/328, 329; 312/245, 291

[56] References Cited

U.S. PATENT DOCUMENTS

| | | | |
|---|---|---|---|
| 733,568 | 7/1903 | Sundh | 174/50 |
| 1,629,267 | 5/1927 | Fischer | 174/50 X |
| 2,250,977 | 7/1941 | Walker | 220/3.8 |
| 2,345,792 | 4/1944 | Cann | 174/50 X |
| 3,386,606 | 6/1968 | Pastrick | 174/50 X |
| 3,895,179 | 7/1975 | Wyatt | 174/50 |
| 4,988,832 | 1/1991 | Shotey | 174/53 X |
| 5,066,832 | 11/1991 | Clarey et al. | 174/50 |

FOREIGN PATENT DOCUMENTS

| | | | |
|---|---|---|---|
| 2257695 | 5/1974 | Fed. Rep. of Germany | 174/50 |
| 171827 | 12/1934 | Switzerland | 174/50 |

*Primary Examiner*—Mark Rosenbaum
*Assistant Examiner*—S. Thomas Hughes
*Attorney, Agent, or Firm*—ROBIC

[57] ABSTRACT

A general purpose box kit normally used in electricity as, for example, a junction box, a splicing box or a wire drawing box. The kit includes a metal housing having an opening suitable to be close either by a pivotable lid or by a flat lid directly screwed thereon. It allows change of the lid without having to change the whole box.

11 Claims, 2 Drawing Sheets

GENERAL PURPOSE ELECTRICAL BOX KIT

FIELD OF THE INVENTION

The present invention is concerned with a general purpose box normally used in electricity as, for example, a junction box, a splicing box, a wire drawing box or an auxiliary equipment housing. The shape and the dimension of the box depend on the type of switches, bus bars, connections and cable-end sections adjacent the connections, or any other element suitable to be installed therein.

DESCRIPTION OF PRIOR ART

There exists many types of general purpose electrical boxes in the industry. Examples of such boxes are disclosed in U.S. Pat. Nos. 2,345,792, 3,386,606 and 3,895,179.

Most of the general purpose boxes conventionally used in the industry consist of a rectangular metal box having a front opening that may be closed either with a lid pivotally mounted on hinges or with a plate that can be screwed on flanges surrounding the opening. Both of these boxes are very popular and in high demand. As a result, the suppliers or technicians have to keep a considerable amount of both of them in stock. Since both kinds of boxes have almost the same shape and differ only in the way their closing lid or plate are fixed, a lot of storage space is wasted. None of the above-mentioned patents disclose a way to overcome this drawback.

SUMMARY OF THE INVENTION

To overcome the above-mentioned storage drawback, the present invention propose a general purpose box on which can easily be assembled any kind of closing lid or plate, thus making it possible to keep in store less boxes without restricting the choice.

More particularly, the object of the present invention is to provide a general purpose electrical box kit comprising:

(a) an open housing, preferably made of metal, the housing having a bottom wall and four sidewalls, the four sidewalls having upper edges defining together an opening;

(b) means to fix the housing onto a supporting structure; (c) a plurality of breakable disks made within at least one of the four sidewalls; (d) at least two flanges integrally projecting from the upper edges of at least two of the sidewalls opposite to each other, the flanges extending in a plane parallel to the bottom wall and facing each other;

(e) a first set of holes comprising at least two holes made in the at least two flanges, respectively;

(f) a second set of two holes made in the sidewalls, the two holes being coaxial and located in upper corners of two of the sidewalls opposite to each other;

(g) a first lid attachable onto the housing to close the opening by means of fixation means inserted into holes made in the first lid and positioned to fit into the holes of the first set of holes; and (h) a second lid attachable onto the housing to close the opening by means of fixation means inserted into holes made in at least two opposite flanges extending in a plane parallel to one of the sidewalls and located outside thereof when the second lid is closing the housing, the holes corresponding to one of the holes of the second set of holes, the two coaxial holes forming, along with their corresponding holes of the second lid and the fixation means inserted therethrough, a swivel; wherein the housing can be used with any one of the first or second lid.

According to a preferred embodiment, the second lid further comprises a handle affixed thereon to ease its opening, and locking means for locking the second lid on the housing.

The housing may further comprise means to fix an object therein, such as a ground terminal.

The means used to fix the housing on a supporting structure may be a set of holes made in the bottom wall, in which screws are inserted.

Preferably, the screws used for operatively attaching the first lid and the screws used for operatively attaching the second lid are identical.

According to another preferred embodiment, the holes of the first and second set of holes are threaded holes, and the fixation means are screws.

According to a still preferred embodiment, the fixation means are taper pins.

A non restrictive description of a preferred embodiment will now be given with reference to the appended drawings.

DESCRIPTION OF A PREFERRED EMBODIMENT

Figure 1:
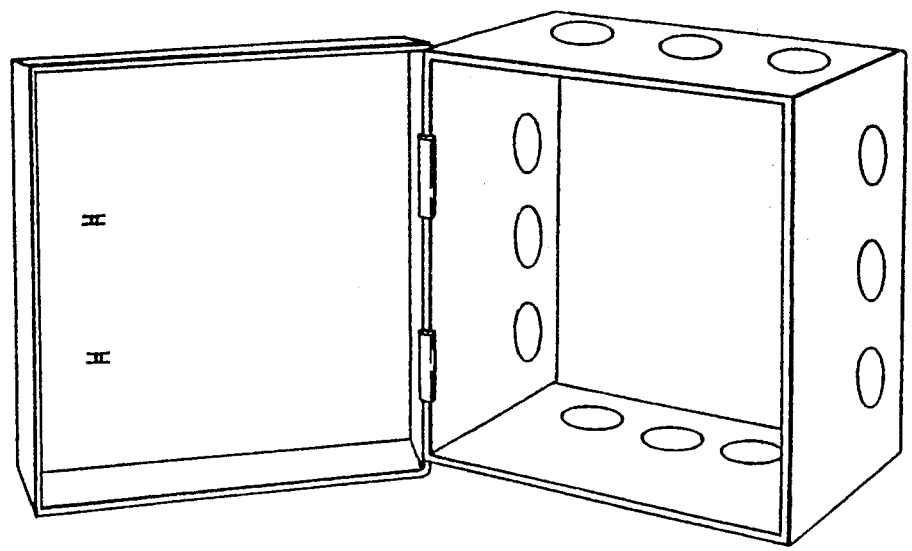
FIG. 1 is a perspective view of a conventional general purpose box with a pivotable lid as found in the prior art.
Figure 2:
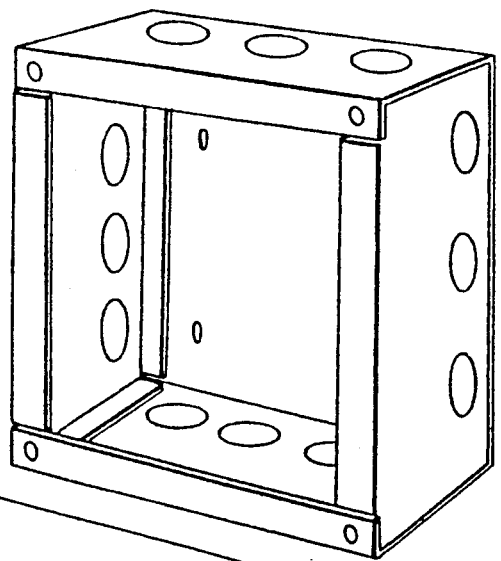
FIG. 2 is a perspective view of a conventional general purpose box with a screwed lid as found in the prior art.
Figure 3:
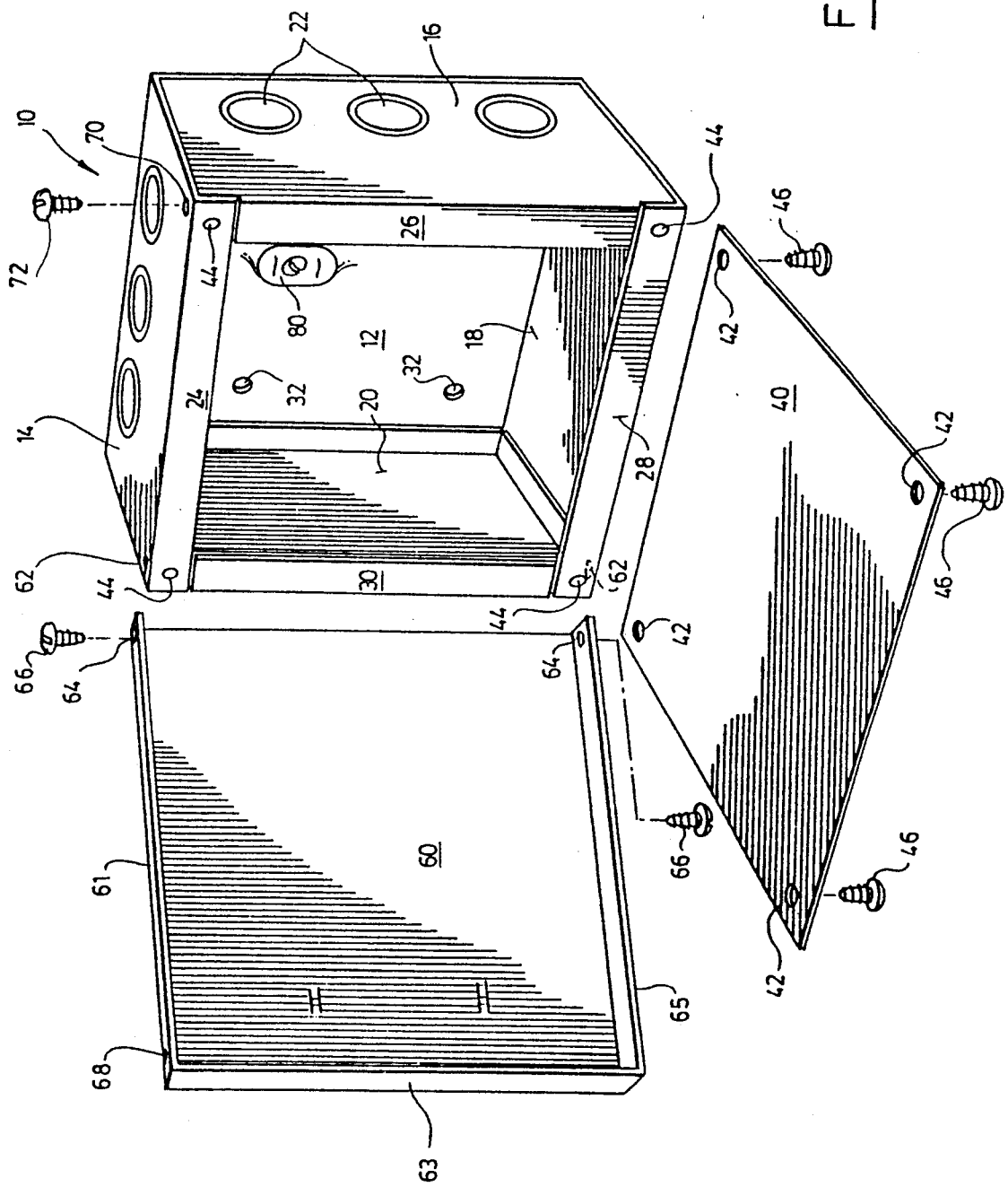
FIG. 3 is a perspective view of the general purpose box according to the invention.

The general purpose box kit according to the invention as shown in FIG. 3, comprises a rectangular shaped metal housing 10 with a top opening. The housing 10 consists of a bottom wall 12 and four sidewalls 14, 16, 18 and 20. The sidewalls have a plurality of breakable disks 22 for allowing electrical wires to be inserted into the box. Fibre optics, telephone cables, hydraulic lines or like can also be used instead of electrical wires.

Each of the sidewalls 14, 16, 18 and 20 has a flange, respectively numbered 24, 26, 28 and 30, integrally projecting from their upper edge toward the interior of the opening of housing 10 and extending parallel to the bottom wall 12. However, only two flanges facing each other may be suitable.

Holes 32 are provided on the bottom wall 12 of the housing 10 for fixing it on a wall with screws. Other fastening means can also be used.

The kit also comprises a first lid 40 and a second lid 60 attachable onto the housing 10 to close the opening.

The first lid 40 consists of a flat metal plate in which holes 42 are made near every of its corners. These holes 42 ar positioned to coaxially positioned with the threaded holes 44. The screws 46 allow the first lid 40 to be operatively attached over the opening of the housing 10. However, only two pairs of holes 42 and 44 may be suitable.

The second lid 60 consists of a metal plate with three flanges 61, 63 and 65 integrally projecting from three of its four edges, perpendicular to the metal plate. The flanges 61, 63 and 65 extend in a plane parallel to the corresponding sidewall and located outside thereof when said second lid 60 is closing the opening of the housing 10. Two coaxial threaded holes 62 located in upper corners of two of the sidewalls, opposite to each other, match with two corresponding coaxial holes 64 located on two opposite flanges of the second lid 60, near the edge without a flange. The coaxial holes 62 and 64 are forming, along with screws 66 inserted therethrough, a swivel.

The second lid 60 is locked on t he opening of the housing 10 by means of a third hole 68 matching with a threaded hole 70 located on the sidewall 14, for example, and in Which a screw 72 is inserted through both of them. Additional holes or laterally disposed holes (not shown) are also suitable for locking the second lid 60.

Any other kind of fastening means or even a lock may also be used. However, it may not be essential to lock the second lid 60 for keeping a free and quick access, for example. It may be suitable to design the second lid 60 and the housing 10 so a slight force have to be exerted to open the second lid 60.

A handle (not shown) affixed onto the second lid is used to ease its opening.

Additionally, the housing 10 may be provided with a fixture means 80 to allow any electrical components, such as a switch or a fuse (not shown), to be mounted therein. This fixture means 80 may also be used as a ground terminal.

Instead of threaded holes, it is possible to use standard holes and the screws can be replaced by taper pins.

With this box kit, only one type of housing is needed for both kinds of lids. It allows also to change the lid without having to change the whole box.

The embodiments of the invention in which an exclusive property or privilege is claimed are defined as follows:

1. A general purpose electrical box kit comprising:
   (a) an open housing, said housing having a bottom wall and four sidewalls, said four sidewalls having upper edges defining together an opening;
   (b) means for fixing said housing onto a supporting structure;
   (c) a plurality of breakable disks made within at least one of said four sidewalls;
   (d) at least two flanges integrally projecting from the upper edges of at least two of said sidewalls opposite to each other, said flanges extending in a plane parallel to said bottom wall and facing each other;
   (e) a first set of holes comprising at least two holes made in said at least two flanges, respectively;
   (f) a second set of two holes made in said sidewalls, said two holes being coaxial and located in upper corners of two of said sidewalls opposite to each other;
   (g) a first lid attachable onto said housing for closing said opening by means of fixation means inserted into holes made in said first lid and positioned for fitting into the holes of said first set of holes; and
   (h) a second lid attachable onto said housing for closing said opening by means of fixation means inserted into holes made in at least two opposite flanges on said second lid extending in a plane parallel to one of said sidewalls and located outside thereof when said second lid is closing said housing, said holes corresponding to one of said holes of said second set of holes, said two coaxial holes forming, along with their corresponding holes of said second lid and said fixation means inserted therethrough, a swivel;
wherein said housing is used with any one of said first or second lid.

2. The kit of claim 1, further comprising a handle affixed onto said second lid to ease its opening and locking means for locking said second lid on said housing.

3. The kit of claim 1, wherein said housing is made of metal.

4. The kit of claim 3, further comprising means for fixing an object inside said housing.

5. The kit of claim 4, wherein said means for fixing an object inside of said housing is a ground terminal.

6. The kit of claim 1, wherein said means for fixing said housing onto said supporting structure is a set of holes made in said bottom wall, in which screws are inserted.

7. The kit of claim 1, wherein said fixation means of said first and second lids comprise identical screws.

8. The kit of claim 1, wherein said holes of said first and second set of holes are threaded holes, and said fixation means of said first and second lids are screws.

9. The kit of claim 1, wherein said fixation means of said first and second lids are taper pins.

10. A general purpose electrical box kit comprising:
   (a) a metal open housing, said housing having a bottom wall and four sidewalls, said four sidewalls having upper edges defining together an opening;
   (b) a set of holes made in said bottom wall in which screws are inserted for fixing said housing onto a supporting structure;
   (c) a plurality of breakable disks made within at least one of said four sidewalls;
   (d) at least two flanges integrally projecting from the upper edges of at least two of said sidewalls opposite to each other, said flanges extending in a plane parallel to said bottom wall and facing each other;
   (e) a first set of holes comprising at least two holes made in said at least two flanges, respectively;
   (f) a second set of holes, comprising at least three holes made in said sidewalls, two of said at least three holes being coaxial and located in upper corners of two of said sidewalls opposite to each other;
   (g) a first lid attachable onto said housing for closing said opening by means of screws inserted into holes made in said first lid and positioned for fitting into the holes of said first set of holes; and
   (h) a second lid attachable onto said housing for closing said opening by means of taper pins inserted into holes made in at least two opposite flanges on said second lid extending in a plane parallel to one of said sidewalls and located outside thereof when said second lid is closing said housing, said holes corresponding to one of said holes of said second set of holes, said two coaxial holes forming, along with their corresponding holes of said second lid and said taper pins inserted therethrough, a swivel, said second lid also comprising a handle affixed thereon for easing its opening;
   (i) means for fixing an object inside said housing;
wherein said housing is used with any one of said first or second lid.

11. A general purpose electrical box kit comprising:
   (a) a metal open housing, said housing having a bottom wall and four sidewalls, said four sidewalls having upper edges defining together an opening;

(b) a set of holes made in said bottom wall in which screws are inserted for fixing said housing onto a supporting structure;

(c) a plurality of breakable disks made within at least one of said four sidewalls;

(d) at least two flanges integrally projecting from the upper edges of at least two of said sidewalls opposite to each other, said flanges extending in a plane parallel to said bottom wall and facing each other;

(e) a first set of threaded holes comprising at least two threaded holes made in said at least two flanges, respectively;

(f) a second set of threaded holes comprising at least three threaded holes made in said sidewalls, two of said at least three threaded holes being coaxial and located in upper corners of two of said sidewalls opposite to each other;

(g) a first lid attachable onto said housing for closing said opening by means of screws inserted into holes made in said first lid and positioned for fitting into the threaded holes of said first set of threaded holes; and (h) a second lid attachable onto said housing for closing said opening by means of screws inserted into holes made in at least two opposite flanges on said second lid extending in a plane parallel to one of said sidewalls and located outside thereof when said second lid is closing said housing, said holes corresponding to one of said threaded holes of said second set of threaded holes, said two coaxial threaded holes forming, along with their corresponding holes of said second lid and said screws inserted therethrough, a swivel, said second lid also comprising a handle affixed thereon for easing its opening;

(i) means for fixing an object inside said housing; wherein said housing is used with any one of said first or second lid, said screws used for operatively attaching said first lid and said screws used for operatively attaching said second lid being identical.

* * * * *